US009935248B2

(12) United States Patent
Kong

(10) Patent No.: US 9,935,248 B2
(45) Date of Patent: Apr. 3, 2018

(54) LIGHT EMITTING DEVICE PACKAGE

(71) Applicant: LG INNOTEK CO., LTD., Seoul (KR)

(72) Inventor: Sung Min Kong, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 0 days.

(21) Appl. No.: 15/581,464

(22) Filed: Apr. 28, 2017

(65) Prior Publication Data

US 2017/0317248 A1 Nov. 2, 2017

(30) Foreign Application Priority Data

Apr. 28, 2016 (KR) .................. 10-2016-0052426

(51) Int. Cl.
*H01L 33/00* (2010.01)
*H01L 33/56* (2010.01)
*H01L 33/50* (2010.01)
*H01L 33/54* (2010.01)
*H01L 33/62* (2010.01)
*H01L 33/58* (2010.01)
*H01L 25/075* (2006.01)
*H01L 33/48* (2010.01)

(52) U.S. Cl.
CPC .......... *H01L 33/56* (2013.01); *H01L 25/0753* (2013.01); *H01L 33/48* (2013.01); *H01L 33/483* (2013.01); *H01L 33/486* (2013.01); *H01L 33/50* (2013.01); *H01L 33/505* (2013.01); *H01L 33/507* (2013.01); *H01L 33/508* (2013.01); *H01L 33/54* (2013.01); *H01L 33/58* (2013.01); *H01L 33/62* (2013.01)

(58) Field of Classification Search
None
See application file for complete search history.

(56) References Cited

U.S. PATENT DOCUMENTS

| | | | |
|---|---|---|---|
| 2016/0087163 A1* | 3/2016 | Fukuda ................. | H01L 33/504 257/98 |
| 2016/0126437 A1* | 5/2016 | Park ...................... | H01L 33/647 257/98 |
| 2016/0141472 A1* | 5/2016 | Son ....................... | H01L 33/507 257/98 |

* cited by examiner

*Primary Examiner* — Minh-Loan Tran
(74) *Attorney, Agent, or Firm* — KED & Associates, LLP

(57) ABSTRACT

Embodiments of the present invention relate to a light emitting device package having uniform color characteristics, wherein the light emitting device package includes: a substrate including first and second lead frames; at least two light emitting devices disposed on the substrate and electrically connected to the first and second lead frames; an integrated wavelength conversion film disposed on the at least two light emitting devices and including a first region which overlaps the light emitting devices and a second region other than the first region; at least one recess which passes through the wavelength conversion film in a region corresponding to a gap between the adjacent light emitting devices; and a lens disposed on the substrate to cover the light emitting devices and the first and second lead frames.

20 Claims, 19 Drawing Sheets

LIGHT EMITTING DEVICE PACKAGE

CROSS-REFERENCE TO RELATED APPLICATION

This application claims priority to and the benefit of Korean Patent Application No. 10-2016-0052426, filed on Apr. 28, 2016, the disclosure of which is incorporated herein by reference in its entirety.

BACKGROUND

1. Field of the Invention

The present invention relates to a light emitting device package having uniform color characteristics.

2. Discussion of Related Art

A light emitting diode (LED) is one of devices configured to emit light when a current is supplied thereto. Since LEDs can highly and efficiently emit light using a low voltage, LEDs have an excellent energy-saving effect. Recently, a brightness problem of LEDs has been significantly solved, and thus LEDs are being used for various devices such as a backlight unit (BLU) of a liquid crystal display (LCD) apparatus, an electric signboard, an indicator, and a home appliance.

An LED may have a structure in which a first electrode and a second electrode are disposed at one side of an emitting structure including a first semiconductor layer, an active layer, and a second semiconductor layer. In addition, the first electrode and the second electrode may be electrically connected to an external circuit through a lead frame.

A light emitting device package includes two or more of the above-described LED mounted on a substrate and can generate white light. However, in this case, wavelength conversion films are attached to the LEDs, and thus an adhesive force of the wavelength conversion film for each LED may vary. Accordingly, color uniformity thereof may be decreased.

SUMMARY OF THE INVENTION

The present invention is directed to a light emitting device package in which at least two light emitting devices share one wavelength conversion film.

According to an aspect of the present invention, there is provided a light emitting device package including: a substrate including first and second lead frames; at least two light emitting devices disposed on the substrate and electrically connected to the first and second lead frames; an integrated wavelength conversion film disposed on the at least two light emitting devices and including a first region which overlaps the light emitting devices and a second region other than the first region; at least one recess which passes through the wavelength conversion film in a region corresponding to a gap between the adjacent light emitting devices; and a lens disposed on the substrate to cover the light emitting devices and the first and second lead frames.

According to another aspect of the present invention, there is provided a light emitting device package including: a substrate including first and second lead frames; at least two light emitting devices disposed on the substrate and electrically connected to the first and second lead frames; an integrated wavelength conversion film disposed on the at least two light emitting devices and including a first region which overlaps the light emitting devices and a second region other than the first region; a reflective member which surrounds the side surfaces of the light emitting devices along an edge of the wavelength conversion film; at least one recess which passes through the wavelength conversion film in a region corresponding to a gap between the adjacent light emitting devices; and a lens disposed on the substrate to cover the light emitting devices and the first and second lead frames.

BRIEF DESCRIPTION OF THE DRAWINGS

The above and other objects, features and advantages of the present invention will become more apparent to those of ordinary skill in the art by describing exemplary embodiments thereof in detail with reference to the accompanying drawings, in which.

DETAILED DESCRIPTION OF EXEMPLARY EMBODIMENTS

Figure 1A:
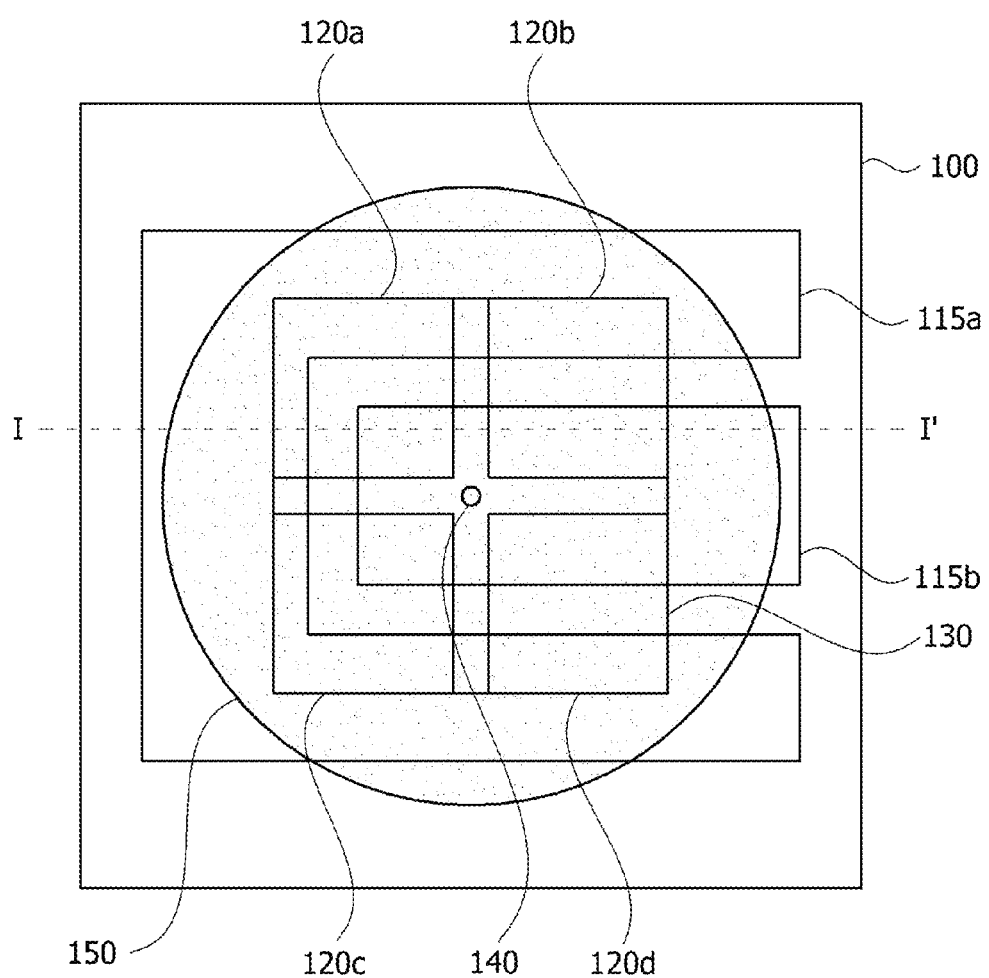
FIG. 1A is a plan view illustrating a light emitting device package according to a first embodiment of the present invention.

While the invention may be modified in various ways and take on various alternative forms, specific embodiments thereof are shown in the drawings and described in detail below as examples. However, it should be understood that there is no intent to limit the invention to the particular forms disclosed and that the invention covers all modifications, equivalents, and alternatives falling within the spirit and scope of the appended claims.

Although terms including ordinal terms such as first, second, and the like may be used herein in reference to elements of the invention, such elements are not to be construed as limited by these terms. These terms are only used to distinguish one element from another. For example, a first element could be termed a second element and a second element could be termed a first element without departing from the scope of the present invention. Herein, the term "and/or" includes any and all combinations of one or more referents.

It should be understood that when an element is referred to as being "connected" or "coupled" to another element, the element can be directly connected or coupled to the other element, or intervening elements may be present therebetween. In contrast, when an element is referred to as being "directly connected" or "directly coupled" to another element, there are no intervening elements.

The terminology used herein to describe embodiments of the invention is not intended to limit the scope of the invention. The articles "a," "an," and "the" are singular in that they have a single referent, however the use of the singular form in the present document does not preclude the presence of more than one referent. In other words, elements of the invention referred to in the singular may number one or more unless the context clearly indicates otherwise. It should be further understood that the terms "comprise," "comprising," "include," and/or "including," when used herein, specify the presence of stated features, numbers, steps, operations, elements, and/or components, but do not preclude the presence or addition of one or more other features, numbers, steps, operations, elements, components, and/or groups thereof.

Unless otherwise defined, all terms including technical and scientific terms used herein have the same meaning as commonly understood by one of ordinary skill in the art to which this invention belongs. It should be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, embodiments of the invention will be described in detail with reference to the accompanying drawings, and the same or corresponding elements will be consistently denoted by the same reference numerals and will not be repeatedly described regardless of the reference numerals.

Hereinafter, a light emitting device package according to an embodiment of the present invention will be described below in detail with reference to the accompanying drawings.

Figure 1B:
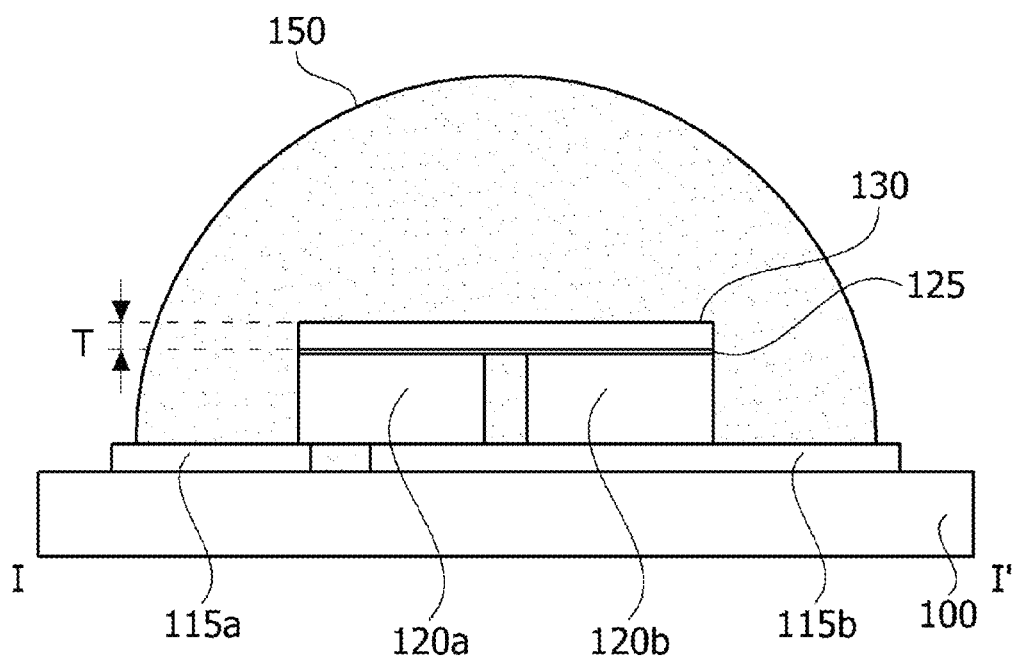
FIGS. 1B and 1C are cross-sectional views taken along line I-I' of FIG. 1A.
Figure 1C:
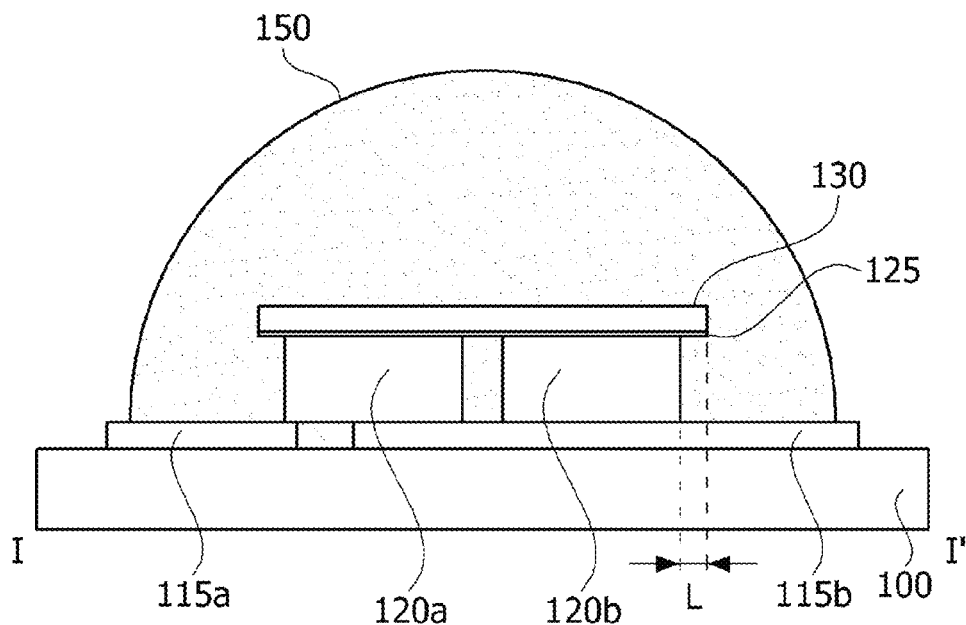

FIG. 1A is a plan view illustrating a light emitting device package according to a first embodiment of the present invention, and FIGS. 1B and 1C are cross-sectional views taken along line I-I' of FIG. 1A. In addition, FIG. 1D is a plan view illustrating a wavelength conversion film in FIG. 1A.

Figure 1D:
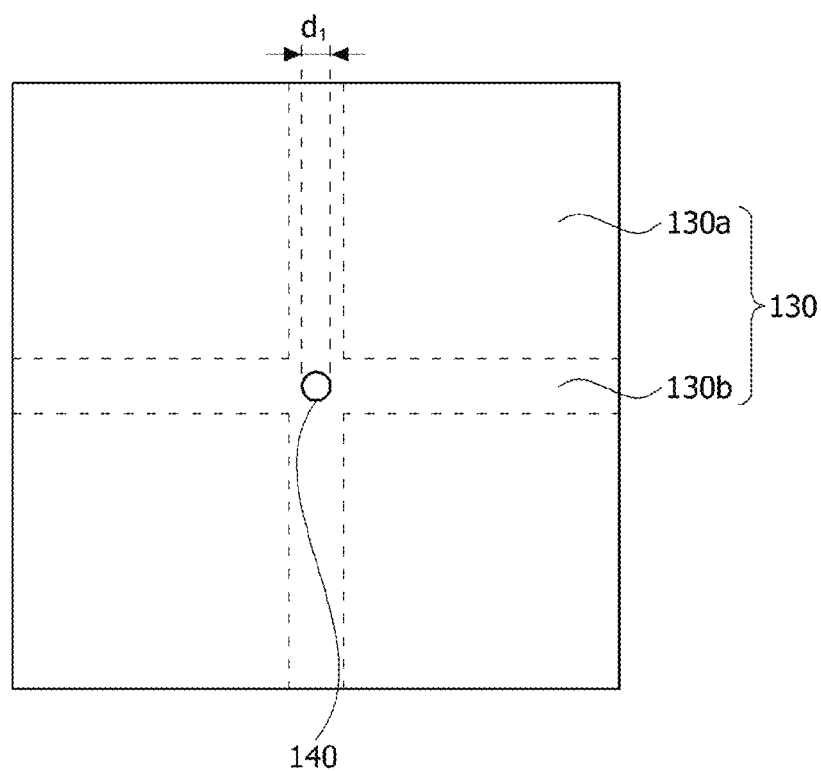
FIG. 1D is a plan view illustrating a wavelength conversion film in FIG. 1A.

As shown in FIGS. 1A, 1B and 1D, the light emitting device package according to the first embodiment of the present invention includes a substrate 100 having first and second lead frames 115a and 115b, at least two of light emitting devices 120a, 120b, 120c, and 120d disposed on the substrate 100 and electrically connected to the first and second lead frames 115a and 115b, an integrated wavelength conversion film 130 disposed on at least two of the light emitting devices 120a, 120b, 120c, and 120d and having a first region 130a, which overlaps at least two of the light emitting devices 120a, 120b, 120c, and 120d, and a second region 130b other than the first region 130a, at least one recess 140 which passes through the wavelength conversion film 130 to correspond to gaps between the light emitting devices 120a, 120b, 120c, and 120d, and a lens 150 disposed on the substrate 100 to cover the light emitting devices 120a, 120b, 120c, and 120d and the first and second lead frames 115a and 115b.

The lens 150 may be made of a transparent resin so that light emitted from the light emitting devices 120a, 120b, 120c, and 120d is easily emitted to the outside, but is not limited thereto. The lens 150 may be formed to have a structure in which an upper surface thereof has a convex dome shape as illustrated so that a directional angle of light emitted from the light emitting device package is improved, but is not limited thereto and may be formed in any of various shapes.

The lens 150 may be directly formed on the substrate 100 by a molding method, such as a compression molding method or transfer molding method, or a porting method using a dispenser, or may be manufactured by a separate process and attached to the substrate 100. Particularly, when the lens 150 is formed using a molding or porting method, a transparent resin may also be filled between adjacent light emitting devices 120a, 120b, 120c, and 120d through the recess 140 which passes through the wavelength conversion film 130 in the light emitting device package according to the embodiment of the present invention.

The substrate 100 may be a ceramic substrate, but is not limited thereto. For example, the substrate 100 may be a ceramic insulating layer made of a nitride or oxide. The above-described substrate 100 may be made of $SiO_2$, $Si_xO_y$, $Si_3N_4$, $Si_xN_y$, $SiO_xN_y$, $Al_2O_3$, or AlN, but is not limited thereto.

The first and second lead frames 115a and 115b may include a conductive material such as Cu or Au having a high conductivity, but is not limited thereto. In addition, the first and second lead frames 115a and 115b may include a reflective material such as Al and may transmit light emitted by the light emitting devices 120a, 120b, 120c, and 120d toward the lens 150. The above-described first and second lead frames 115a and 115b are electrically separated and may be connected to first and second electrodes (not shown) of each of the light emitting devices 120a, 120b, 120c, and 120d. Through such a structure, a current or the like may be supplied to the light emitting devices 120a, 120b, 120c, and 120d through the first and second lead frames 115a and 115b, and thus light may be generated by the light emitting devices 120a, 120b, 120c, and 120d. In addition, shapes of the first and second lead frames 115a and 115b are not limited to those in the drawings and may be easily changed.

The light emitting devices 120a, 120b, 120c, and 120d may be disposed on the substrate 100 and electrically connected to the first and second lead frames 115a and 115b. The light emitting devices 120a, 120b, 120c, and 120d may have a vertical structure, a flip chip structure, or the like, but is not limited thereto. For example, when the light emitting devices 120a, 120b, 120c, and 120d have a flip chip structure, the light emitting devices 120a, 120b, 120c, and 120d are directly connected to the first and second lead frames 115a and 115b without a wire. In addition, when the light emitting devices 120a, 120b, 120c, and 120d have a vertical structure, the light emitting devices 120a, 120b, 120c, and 120d may be electrically connected to the first and second lead frames 115a and 115b through wires.

The light emitting devices 120a, 120b, 120c, and 120d are illustrated in the drawings to be disposed in a 2×2 matrix form, but an arrangement of the light emitting devices 120a, 120b, 120c, and 120d is not limited thereto and may be easily adjusted.

Figure 1E:
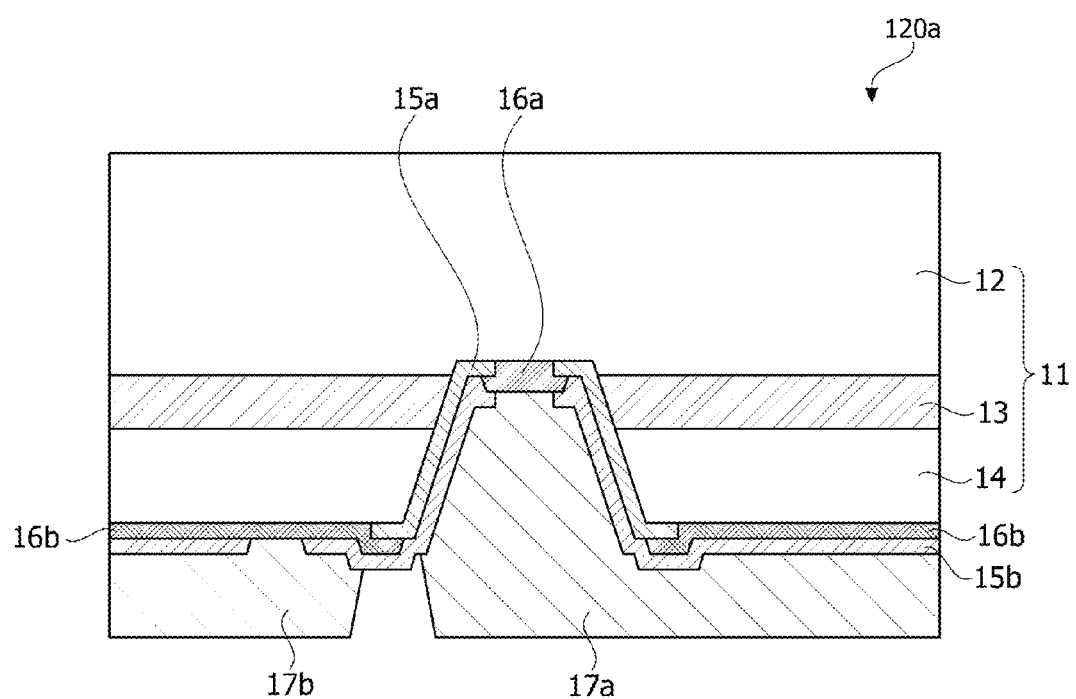
FIG. 1E is a cross-sectional view illustrating the light emitting device in FIG. 1B.

FIG. 1E is a cross-sectional view illustrating the light emitting device of FIG. 1B and shows a flip chip structure.

As illustrated in FIG. 1E, the light emitting device 120a includes a light emitting structure 11 having a first semiconductor layer 12, an active layer 13, and a second semiconductor layer 14, a first electrode 16a connected to the first semiconductor layer 12, a second electrode 16b connected to the second semiconductor layer 14, and first and second electrode pads 17a and 17b respectively connected to the first and second electrodes 16a and 16b.

The first semiconductor layer 12 may be formed using a compound semiconductor included in a III-V group, a II-VI group, or the like and may be doped with a first dopant. The first semiconductor layer 12 may include a semiconductor material having a composition formula of $In_{x1}Al^{y1}Ga^{1-x1-y1}N$, wherein $0 \leq x1 \leq 1$, $0 \leq y1 \leq 1$, and $0 \leq (x1+y1) \leq 1$, and may be selected from, for example, GaN, AlGaN, InGaN, InAlGaN, etc. In addition, the first dopant may be an n-type dopant such as Si, Ge, Sn, Se, or Te. When the first dopant is an n-type dopant, the first semiconductor layer 12 doped with the first dopant may be an n-type semiconductor layer.

The active layer 13 is a layer in which electrons (or holes) injected through the first semiconductor layer 12 are coupled to holes (or electrons) injected through the second semiconductor layer 14. As the electrons and holes are recombined to transition to a low energy level, the active layer 13 may generate light having a wavelength corresponding thereto.

The active layer 13 may have one structure among a single well structure, a multi well structure, a single quantum well structure, a multi quantum well (MQW) structure, a quantum dot structure, or a quantum line structure, but is not limited thereto.

The second semiconductor layer 14 is formed on the active layer 13 and may be made of a compound semiconductor included in a III-V group, a II-IV group, or the like, and may be doped with a second dopant. The second semiconductor layer 14 may be made of a semiconductor material having a compound formula of $In_{x5}Al_{y2}Ga_{1-x5-y}2N$, wherein $0 \leq x5 \leq 1$, $0 \leq y2 \leq 1$, and $0 \leq (x5+y2) \leq 1$, or may be made of a material selected from among AlInN, AlGaAs, GaP, GaAs, GaAsP, and AlGaInP. When the second dopant is a p-type dopant such as Mg, Zn, Ca, Sr, and Ba, the second semiconductor layer 14 doped with the second dopant may be a p-type semiconductor layer.

The first electrode 16a may be electrically connected to the first semiconductor layer 12 through a groove which passes through and exposes the active layer 13 and the second semiconductor layer 14 so that a part of a region of the first semiconductor layer 12 is exposed. Since a first insulating layer 15a is disposed on side surfaces of the first semiconductor layer 12, the active layer 13, and the second semiconductor layer 14 exposed by the groove, the active layer 13 and the second semiconductor layer 14 are prevented from being connected to the first electrode 16a and the first electrode pad 17a. In addition, the second electrode 16b is electrically connected to the second semiconductor layer 14.

The first electrode 16a and the second electrode 16b may be made of a material selected from a group consisting of Ag, Ni, Al, Rh, Pd, Ir, Ru, Mg, Zn, Pt, Au, Hf, Ti, Cr, and Cu, but is not limited thereto. In addition, although not illustrated in the drawings, the first electrode 16a and the second electrode 16b may also be electrically connected to the first and the second semiconductor layers 12 and 14 through an ohmic contact layer formed of a transparent conductive material such as indium tin oxide (ITO). The connection of the first electrode 16a and the second electrode 16b to the first and second semiconductor layers 12 and 14 is not limited thereto.

The second insulating layer 15b may be disposed between the first electrode 16a and the second electrode 16b and between the first electrode pad 17a and the second electrode pad 17b.

The second insulating layer 15b may be made of a material configured to perform both insulation and reflection functions. For example, the second insulating layer 15b may include a distributed Bragg reflector (DBR).

Referring back to FIGS. 1A, 1B, and 1D, the wavelength conversion film 130 may be disposed on the above-described light emitting devices 120a, 120b, 120c, and 120d. When the first semiconductor layer 12 (see FIG. 1E) is directly exposed to upper surfaces of the light emitting devices 120a, 120b, 120c, and 120d as illustrated in FIG. 1E, the wavelength conversion film 130 is directly attached to the first semiconductor layer 12 (see FIG. 1E), and when the light emitting devices 120a, 120b, 120c, and 120d include a support substrate (not shown) on the first semiconductor layer 12 (see FIG. 1E), the wavelength conversion film 130 may be attached to the support substrate (not shown).

The wavelength conversion film 130 may be integrally disposed on the light emitting devices 120a, 120b, 120c, and 120d, and the light emitting devices 120a, 120b, 120c, and 120d may share one wavelength conversion film 130.

Meanwhile, edges of the wavelength conversion film 130 match edges of the light emitting devices 120a, 120b, 120c, and 120d or has a shape which protrudes from the edges of the light emitting devices 120a, 120b, 120c, and 120d as illustrated in FIG. 1C.

When the edges of the wavelength conversion film 130 protrudes from the edges of the light emitting devices 120a, 120b, 120c, and 120d as illustrated in FIG. 1C, light emitted from side surfaces of the light emitting devices 120a, 120b, 120c, and 120d may be converted into white light through a protruding portion of the wavelength conversion film 130. Accordingly, in this case, a color impression of the white light of the light emitting device package can be improved. In addition, when the wavelength conversion film 130 is attached to the light emitting devices 120a, 120b, 120c, and 120d, a process margin can be secured.

Accordingly, a distance L between the edges of the wavelength conversion film 130 and the edges of the light emitting devices 120a, 120b, 120c, and 120d may be in the range of 50 to 150 µm, but is not limited thereto.

As illustrated in FIGS. 1A to 1E, the plurality of light emitting devices 120a, 120b, 120c, and 120d may each be connected to the first and second lead frames 115a and 115b. In addition, the plurality of light emitting devices 120a, 120b, 120c, and 120d may be sequentially connected in series, and the light emitting device 120a and 120d located at both ends thereof may be respectively connected to the first and second lead frames 115a and 115b.

But a connection is not limited thereto. Electric connection between light emitting devices may be easily changed. For example, the first and second lead frames 115a and 115b may be connected to a plurality of light emitting devices 120a, 120b, 120c, and 120d, respectively, with different electrodes.

Through such a structure, the plurality of light emitting devices 120a, 120b, 120c, and 120d in the light emitting device package may be connected in parallel.

Figure 2A:
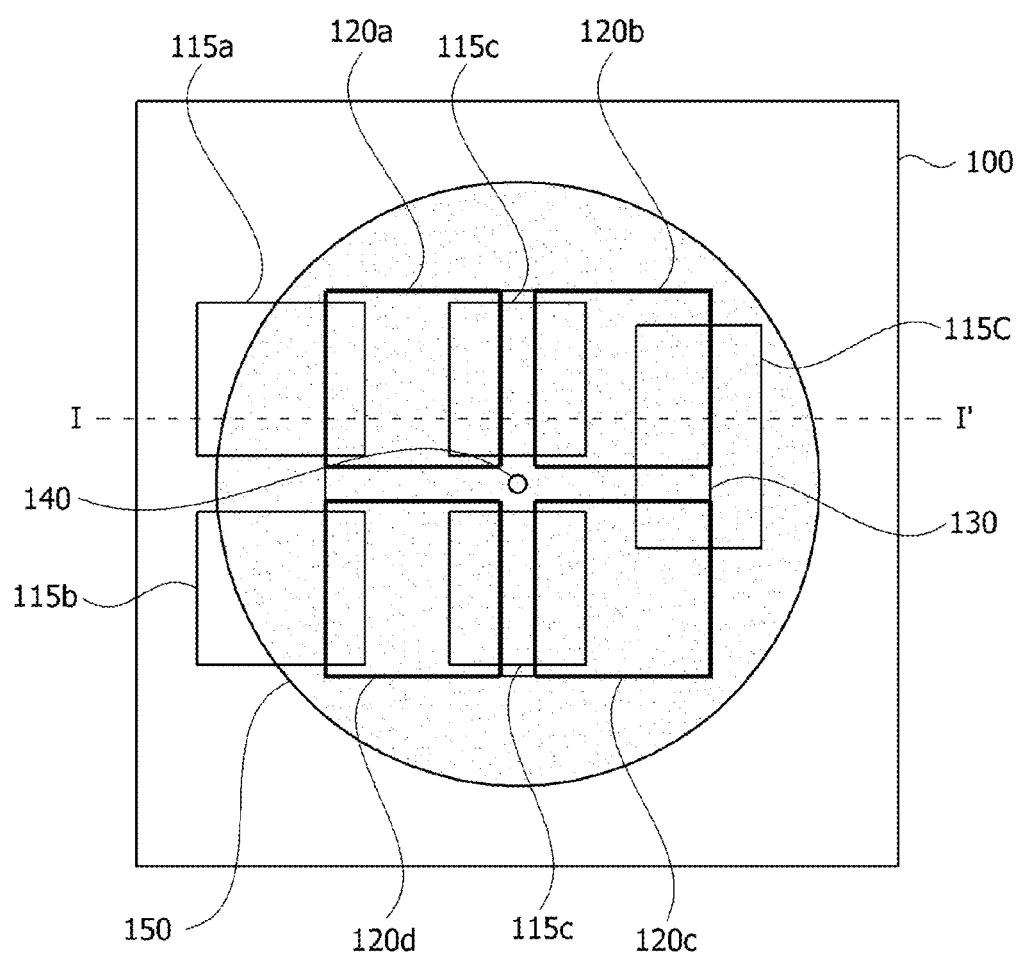
FIG. 2A is a plan view illustrating another structure of the light emitting device package according to the first embodiment of the present invention.

FIG. 2A is a plan view illustrating another structure of the light emitting device package according to the first embodiment of the present invention.

As illustrated in FIG. 2A, the plurality of light emitting devices 120a, 120b, 120c, and 120d may be sequentially connected in series through connecting electrodes 115c. In addition, two light emitting devices 120a and 120d located at both ends thereof may be respectively connected to the first and second lead frames 115a and 115b. Here, shapes of the first and the second lead frames 115a and 115b and the connecting electrodes 115c are not limited to those illustrated in the drawings and may be easily changed. For example, the connecting electrode 115c disposed between the second light emitting device 120b and the third light emitting device 120c may be electrically connected to the first and second lead frames 115a and 115b. The connecting electrode 115c between the first and second light emitting devices 120a and 120b and the connection electrode 115c between the third and fourth light emitting devices 120c and 120d may be electrically connected. Through such a structure, the plurality of light emitting devices 120a, 120b, 120c, and 120d in the light emitting device package may be connected in parallel. However, the present invention is not limited to such a connection, and the electrical connection between the light emitting elements may be easily changed.

Figure 2B:
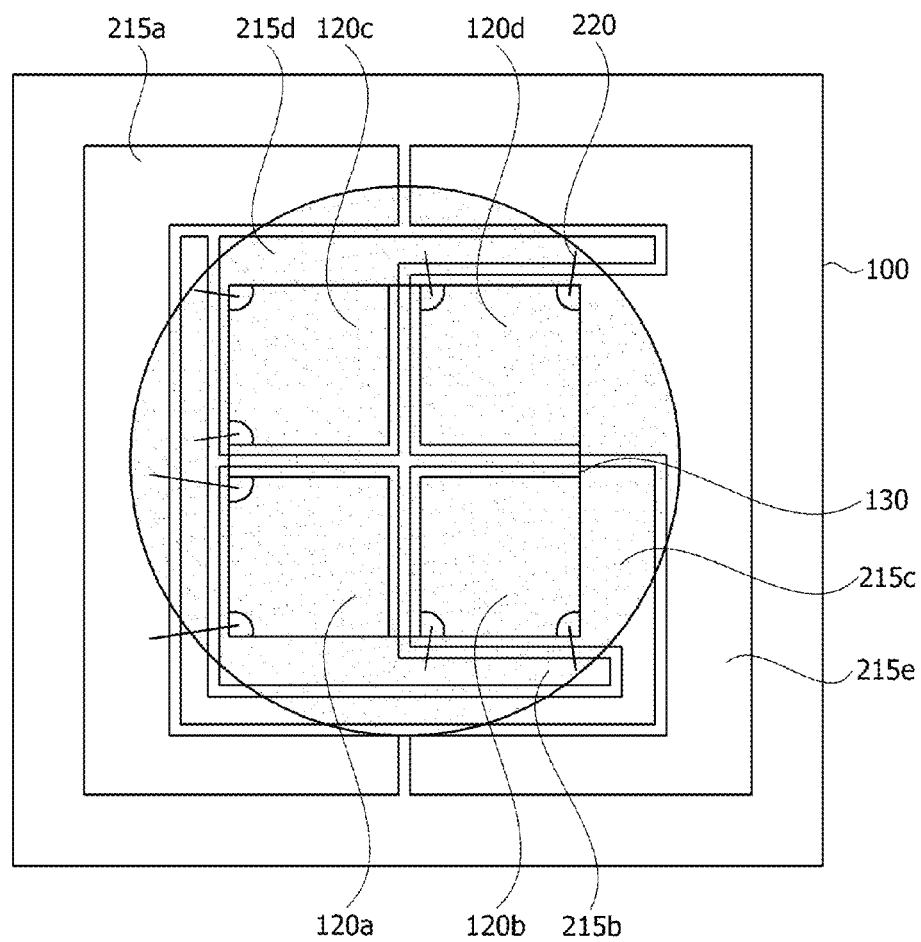
FIG. 2B is a plan view illustrating still another structure of the light emitting device package according to the first embodiment of the present invention.

Meanwhile, when the light emitting devices 120a, 120b, 120c, and 120d have a vertical structure, the plurality of light emitting devices 120a, 120b, 120c, and 120d may be connected as illustrated in FIG. 2B.

FIG. 2B is a plan view illustrating still another structure of the light emitting device package according to the first embodiment of the present invention.

As illustrated in FIG. 2B, the plurality of light emitting devices 120a, 120b, 120c, and 120d may be connected in series through wires 220 and first to fifth lead frames 215a, 215b, 215c, 215d, and 215e. In the above-described vertical type light emitting device, the first electrode and the second electrode of the light emitting device are disposed at different sides. For example, when the first electrode of the first electrode and the second electrode of the light emitting device is directly connected to one lead frame selected from among the first to fifth lead frames 215a, 215b, 215c, 215d, and 215e, the second electrode may be electrically connected to one lead frame selected from the lead frames which are not connected to the first electrode through a wire 220. In the drawing, the second electrode is electrically connected to the lead frame through two wires.

Shapes of the first to fifth lead frames 215a, 215b, 215c, 215d, and 215e and a connection structure of the plurality of light emitting devices 120a, 120b, 120c, and 120d are not limited thereto, and one or more of the light emitting devices selected from among the plurality of light emitting devices 120a, 120b, 120c, and 120d may also be connected in parallel. For example, the first lead frame 215a may be electrically connected to the third lead frame 215c and the fifth lead frame 215e, and the second lead frame 215b may be electrically connected to the fourth lead frame 215d. Through such a structure, the plurality of light emitting devices 120a, 120b, 120c, and 120d may be electrically connected in parallel. Thus, the connection structure between the light emitting devices may be variously changed.

Figure 3A:
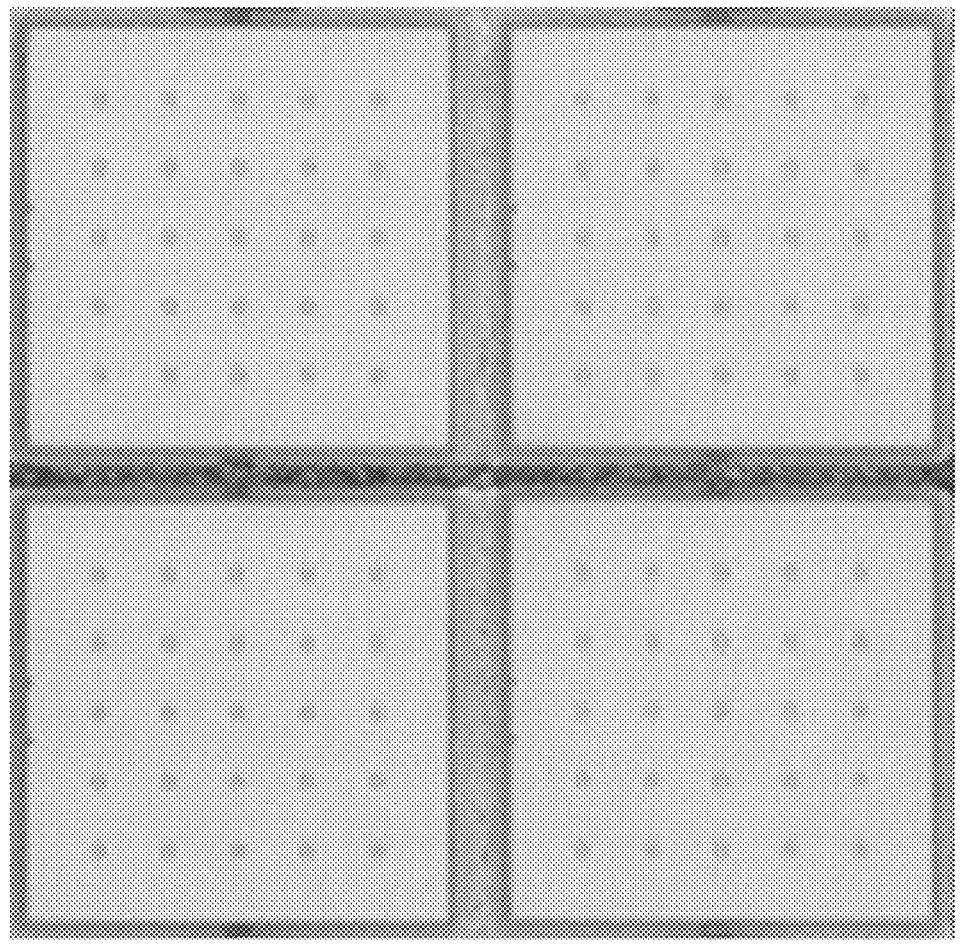
FIGS. 3A and 3B are photographs of a general light emitting device package.
Figure 3B:
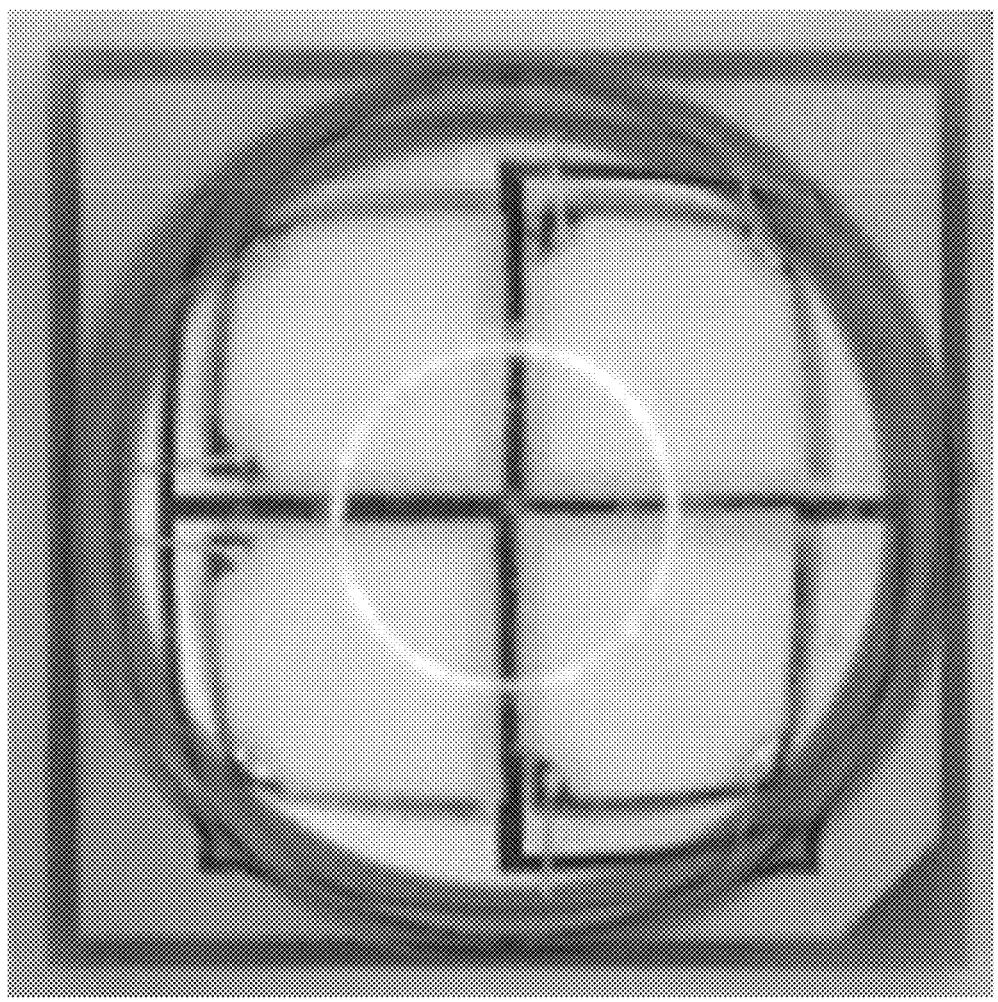

FIGS. 3A and 3B are photographs of a general light emitting device package.

As shown in FIGS. 3A and 3B, in the general light emitting device package, the number of light emitting devices disposed in the light emitting device package is the same as the number of wavelength conversion films. Since a wavelength conversion film is individually attached to a light emitting device in the above-described general light emitting device package, an adhesive force of the wavelength conversion film for each light emitting device may vary. In addition, since white light is not emitted between adjacent light emitting devices, uniform white light is not emitted from the light emitting device package.

On the other hand, as illustrated in FIGS. 1A, 1B, and 1C, since one wavelength conversion film 130 is attached to the plurality of light emitting devices 120a, 120b, 120c, and 120d in the embodiment of the present invention, the wavelength conversion film 130 may be uniformly attached to the light emitting devices 120a, 120b, 120c, and 120d. Through such a structure, the adhesive force of the wavelength conversion film 130 may be equally applied to the light emitting devices 120a, 120b, 120c, and 120d. Accordingly, since an external force is uniformly distributed, reliability of the light emitting device package can be improved and a process thereof can be simplified. In addition, since light generated by the plurality of light emitting devices 120a, 120b, 120c, and 120d is converted into white light by being transmitted through one wavelength conversion film 130, uniformity of the white light can be improved.

In addition, in the general light emitting device package, white light is not emitted from a region corresponding to a light emitting device in which a failure occurs among the plurality of light emitting devices. However, in the light emitting device package according to the embodiment of the present invention, even when there is a light emitting device in which a failure occurs among the plurality of light emitting devices 120a, 120b, 120c, and 120d, light emitted by the remaining light emitting devices which normally operate can be uniformly emitted as white light through the wavelength conversion film.

Figure 4A:
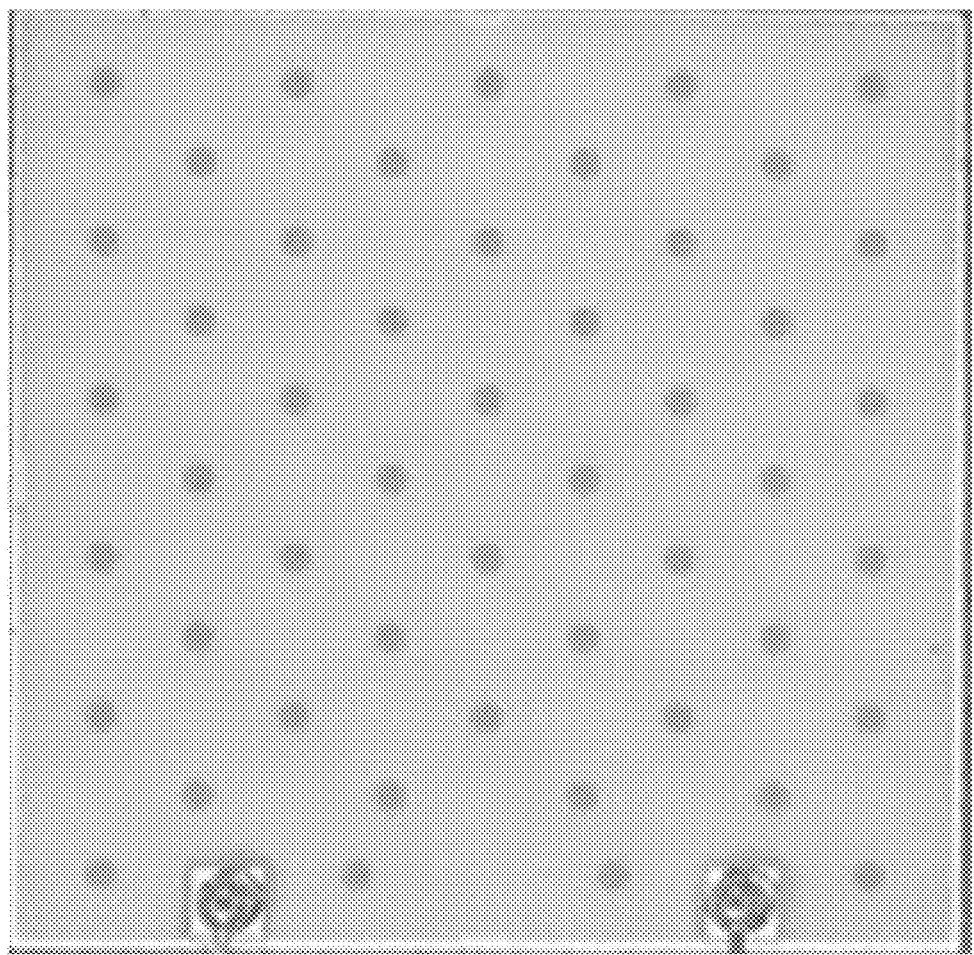
FIGS. 4A and 4B are photographs of the light emitting device package according to the first embodiment of the present invention.
Figure 4B:
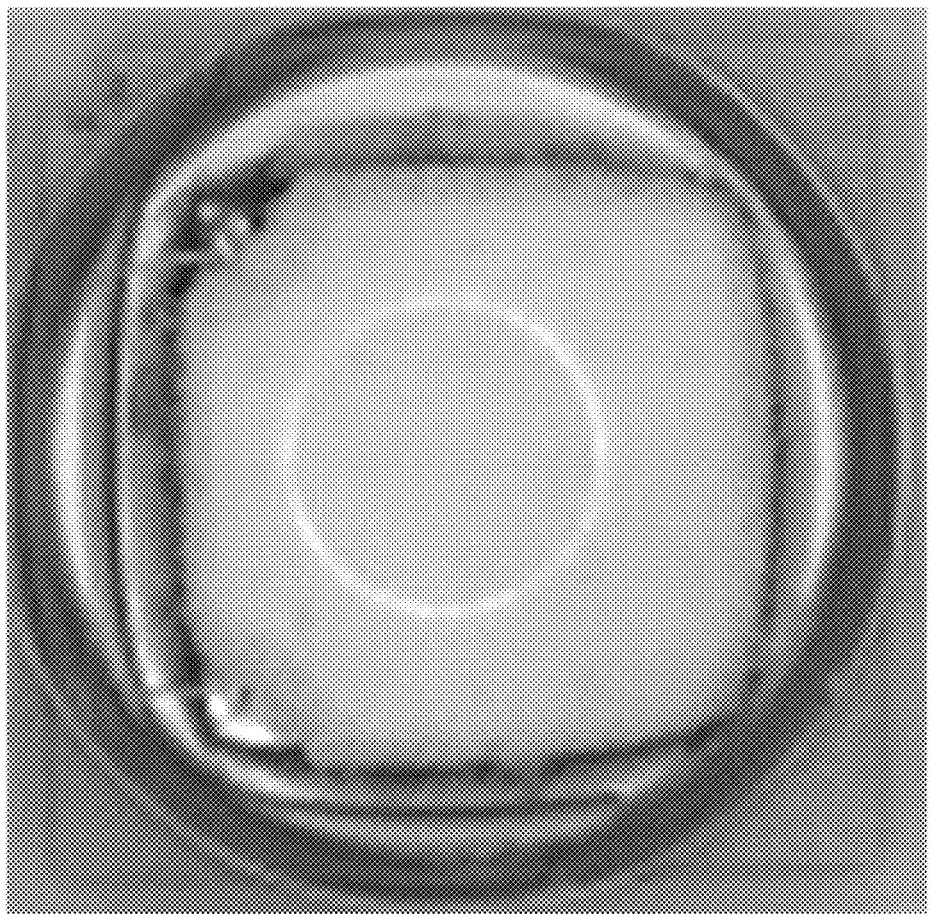

FIGS. 4A and 4B are photographs of the light emitting device package according to the first embodiment of the present invention.

As illustrated in FIGS. 4A and 4B, in the light emitting device package according to the embodiment of the present invention, the integrated wavelength conversion film 130 is disposed on the plurality of light emitting devices 120a, 120b, 120c, and 120d. Here, an area of the integrated wavelength conversion film 130 attached to the plurality of light emitting devices 120a, 120b, 120c, and 120d is greater than that of general wavelength conversion films individually attached on the light emitting devices 120a, 120b, 120c, and 120d. That is, when the wavelength conversion film 130 having a large area is attached to the plurality of light emitting devices 120a, 120b, 120c, and 120d, the wavelength conversion film 130 may be warped or attachment properties thereof may be partially changed.

Accordingly, in the light emitting device package according to the embodiment of the present invention, the wavelength conversion film 130 may be attached to the light emitting devices 120a, 120b, 120c, and 120d using an adhesive layer 125 in which a phenyl-based silicone and a methyl-based silicone are mixed.

Referring back to FIGS. 1A, 1B, and 1C, the adhesive layer 125 in a liquid state is applied on one side surface of the wavelength conversion film 130, the wavelength conversion film 130 is attached to the light emitting devices 120a, 120b, 120c, and 120d using the adhesive layer 125, and the adhesive layer 125 may be cured. Here, when a viscosity of the liquid adhesive layer 125 is too low, the adhesive layer 125 may flow up to the side surfaces of the light emitting devices 120a, 120b, 120c, and 120d.

A hardness of the phenyl-based silicone is generally higher than that of the methyl-based silicone. In addition, stickiness and heat resistance of the methyl-based silicone are higher than that of the phenyl-based silicone, and the hardness of the methyl-based silicone is lower than that of the phenyl-based silicone. Accordingly, the adhesive layer 125 according to the embodiment of the present invention in which the phenyl-based silicone and the methyl-based silicone are mixed has a higher stickiness than an adhesive layer made of only the phenyl-based silicone and has a higher hardness than an adhesive layer made of only the methyl-based silicone.

Particularly, when content of the phenyl-based silicone is too much higher than that of the methyl-based silicone in the adhesive layer 125, a hardness of the adhesive layer 125 is too high and the viscosity thereof is too low, and thus the adhesive layer 125 has a high probability of being cracked. Accordingly, the content of the phenyl-based silicone is lower than that of the methyl-based silicone included in the adhesive layer 125, and the content of the phenyl-based silicone may be in the range of 20% to 40% of the adhesive layer 125. More preferably, the content of the phenyl-based silicone may be 30% of the adhesive layer 125. Here, the viscosity of the adhesive layer 125 may be easily adjusted by adjusting content of the phenyl-based silicone and the methyl-based silicone. In addition, the hardness of the cured adhesive layer 125 may be in the range of A50 to A60 and, for example, may be A55.

A thickness T of the wavelength conversion film 130 may be in the range of 50 to 100 μm. When the thickness T of the wavelength conversion film 130 is too low, the edge of the wavelength conversion film 130 is warped by heat generated when the light emitting device package is driven, and thus the wavelength conversion film 130 may be separated from the light emitting devices 120a, 120b, 120c, and 120d. In addition, when the thickness T of the wavelength conversion film 130 is 100 μm or more and the recess 140 is formed to pass through the wavelength conversion film 130, forming precision thereof may be lowered.

The thickness of the wavelength conversion film 130 may be adjusted according to color characteristics of white light emitted from the light emitting device package. For example, when the white light emitted from the light emitting device package is cool white light, the thickness T of the wavelength conversion film 130 may be in the range of 50 to 80 μm, and when the white light emitted therefrom is neutral white light, the thickness T thereof may be in the range of 70 to 90 μm. In addition, when the white light emitted therefrom is warm white light, the thickness T thereof may be in the range of 80 to 100 μm.

Table 1 below is a comparative table for characteristics of a conventional light emitting device package and the light emitting device package according to the embodiment of the present invention, and deviations of correlated color temperature ΔCCT are compared.

Since wavelength conversion films are individually attached to light emitting devices in the conventional light emitting device package, an adhesive force of the wavelength conversion film for each light emitting diodes (LED) may vary. In addition, color uniformity thereof may be accordingly decreased. Accordingly, the ΔCCT thereof is high.

On the other hand, in the light emitting device package according to the embodiment of the present invention, since one wavelength conversion film is attached to the plurality of light emitting devices, the wavelength conversion film may be uniformly attached to the light emitting devices. Accordingly, color uniformity and color characteristics of light emitted from the light emitting device package are improved and the ΔCCT can be lowered.

TABLE 1

|  | Conventional light emitting device package | Light emitting device package according to the embodiment |
|---|---|---|
| CCT (Average) | 6028 | 5882 |
| CCT (Minimum) | 4688 | 4784 |
| CCT (Maximum) | 7858 | 7464 |
| ΔCCT | 3170K | 2680K |

Furthermore, when the number of light emitting devices 120a, 120b, 120c, and 120d is increased or a size of the light emitting device package is increased, an area of the wavelength conversion film 130 is also increased, and thus stress of the wavelength conversion film 130 may be generated. In this case, since the thickness of the wavelength conversion film 130 may be partially different, properties of light passing through the wavelength conversion film 130 may be nonuniform. In this case, color properties of the light emitting device package are lowered.

Accordingly, the wavelength conversion film 130 may include at least one recess 140 which passes through the wavelength conversion film 130 to relieve stress of the wavelength conversion film 130. Here, the recess 140 may be disposed between adjacent light emitting devices 120a, 120b, 120c, and 120d so that the light emitting devices 120a, 120b, 120c, and 120d are not exposed in a region in which the recess 140 is formed. For example, the recess 140 may be formed in the second region 130b of the wavelength conversion film 130. Here, the number of the recess 140 may be increased as an area of the wavelength conversion film 130 is increased.

In addition, since the area of the wavelength conversion film 130 is increased as separation distances between the light emitting devices 120a, 120b, 120c, and 120d are increased, the number or diameters d of the recess 140 may be increased.

The diameter d of the recess 140 may be 40 μm or more and may be smaller than the separation distances between the light emitting devices 120a, 120b, 120c, and 120d. Here, since the recess 140 is a region from which the wavelength conversion film 130 is removed, when the diameter of the recess 140 is too big, the area of the wavelength conversion film 130 is decreased. For example, when the diameter of the recess 140 is too big, a light emitting efficiency of the light emitting device package is decreased, light emitted from the light emitting devices 120a, 120b, 120c, and 120d is directly emitted through the recess 140, and thus the light may leak. Accordingly, the diameter d of the recess 140 may be in the range of 40 to 120 μm.

Specifically, when the light emitting device package is driven, the first region 130a of the wavelength conversion film 130 which overlaps the light emitting devices 120a, 120b, 120c, and 120d is directly affected by heat generated when the light emitting devices 120a, 120b, 120c, and 120d emit light. That is, although the first region 130a of the wavelength conversion film 130 is expanded by heat generated by the light emitting devices 120a, 120b, 120c, and 120d, an influence on the second region 130b according to the heat generated by the light emitting devices 120a, 120b, 120c, and 120d may be lower compared with the first region 130a. Accordingly, when the light emitting device package is driven, degrees of expansion of the first region 130a and the second region 130b of the wavelength conversion film 130 may be different. In addition, as the light emitting device package is repeatedly turned on and off, the degrees of thermal expansion of the first region 130a and the second region 130b of the wavelength conversion film 130 are increased, and thus a crack of the wavelength conversion film 130 may occur or a crack of the lens 150 may occur.

Accordingly, the recess 140 formed in the second region 130b of the wavelength conversion film 130, that is, formed between adjacent light emitting devices 120a, 120b, 120c, and 120d, may relieve a difference in the degrees of thermal expansion of the first and second regions 130a and 130b of the wavelength conversion film 130. Accordingly, the recess 140 may be disposed at a central portion of the wavelength conversion film 130 and may efficiently prevent a difference in degrees of thermal expansion in the wavelength conversion film 130.

Furthermore, when a resin is molded to form the lens 150, gaps between the light emitting devices 120a, 120b, 120c, and 120d may be filled with the resin through the recess 140. That is, a region in which the second region 130b of the wavelength conversion film 130 overlaps the substrate 100 and an inside of the recess 140 may also be filled with the resin.

Accordingly, in the light emitting device package according to the embodiment of the present invention, the first region 130a of the wavelength conversion film 130 is pressed against the light emitting devices 120a, 120b, 120c, and 120d, and the second region 130b may be pressed against the resin which fills the gaps between the light emitting devices 120a, 120b, 120c, and 120d. Through such a structure, the wavelength conversion film 130 may be stably disposed on the light emitting devices 120a, 120b, 120c, and 120d.

Figure 5A:
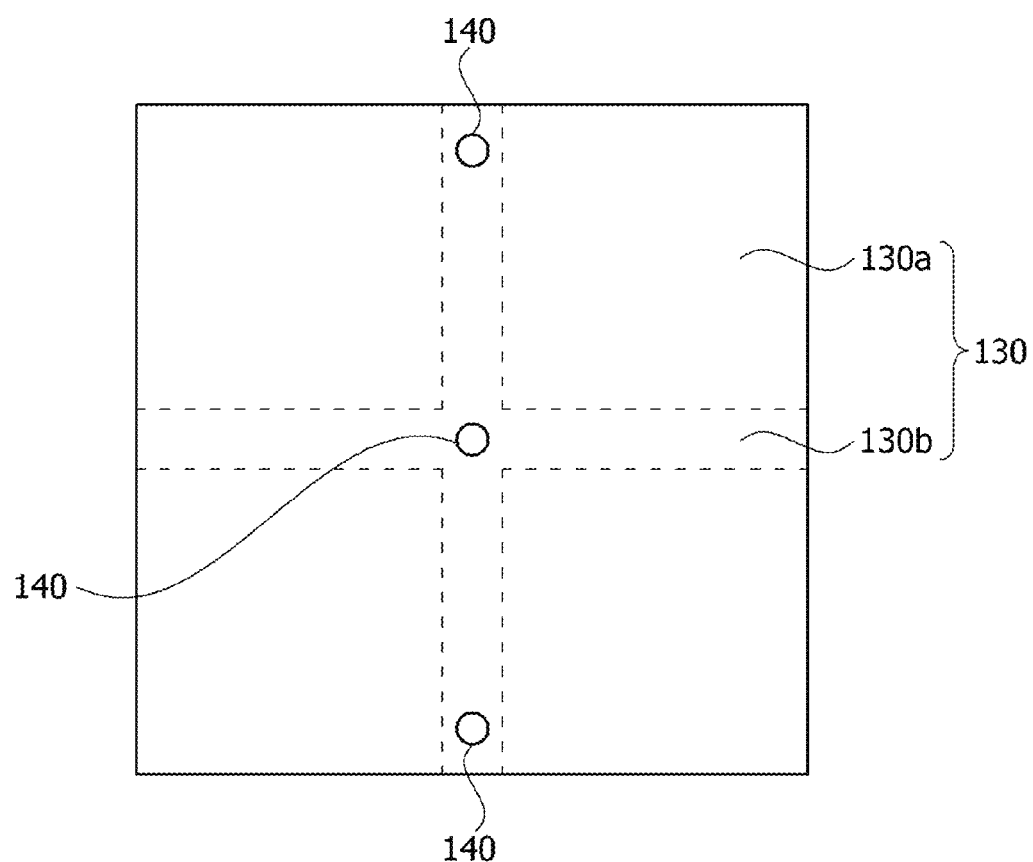
FIG. 5A and FIG. 5B are plan views illustrating a wavelength conversion film including a plurality of recess.
Figure 5B:
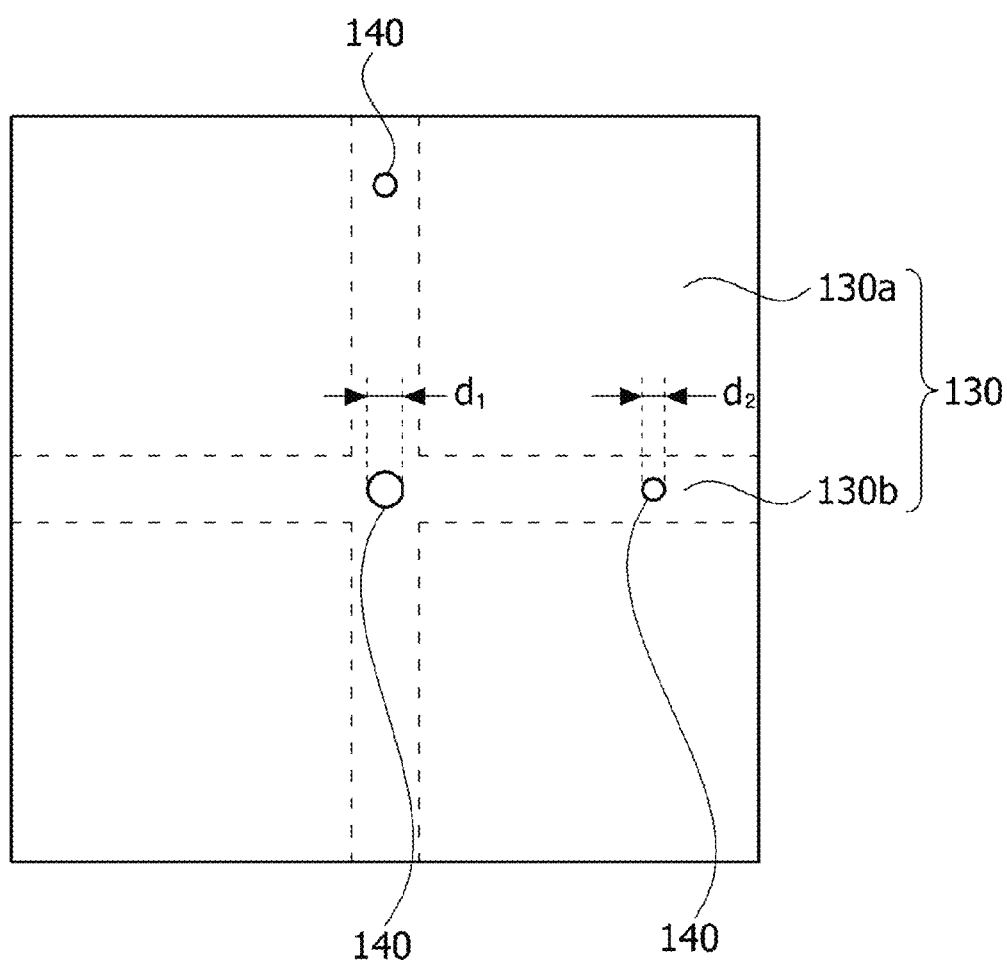

FIG. 5A and FIG. 5B are plan views illustrating a wavelength conversion film including a plurality of recess.

Shapes of the recess 140 may be a shape selected from a circular shape, an oval shape, a polygonal shape, and the like as illustrated in the drawings. Particularly, it is preferable for the recess 140 to be formed in the central portion of the wavelength conversion film 130 to easily relieve the difference in the degrees of thermal expansion in the wavelength conversion film 130. In addition, the recess 140 is not limited thereto and may be selectively formed at an edge of the wavelength conversion film 130 as illustrated in FIGS. 5A and 5B, and the number thereof may be one or more.

Particularly, as the number of recess 140 is increased, a degree of stress relief of the wavelength conversion film 130 is improved, and the gaps between the light emitting devices 120a, 120b, 120c, and 120d may be easily filled with the resin for forming the lens 150. In addition, when the number of recess 140 is two or more, the recess 140 may have different diameters d1 and d2. In addition, a total sum of diameters of recess 140 having small diameters may be the same as a diameter of a largest recess 140 having the largest diameter.

In addition, the recess 140 may be disposed between adjacent light emitting devices 120a, 120b, 120c, and 120d. In addition, the recess 140 may be symmetrically disposed to uniformly remove the difference in the degrees of thermal expansion. In addition, a size of the recess 140 having a large diameter and adjacent to the light emitting devices 120a, 120b, 120c, and 120d may be greater than that of the recess 140 having a small diameter and adjacent to the light emitting devices 120a, 120b, 120c, and 120d. Through such a structure, the difference in the degrees of thermal expansion in the wavelength conversion film 130 is relived, and thus reliability thereof can be improved.

Figure 6A:
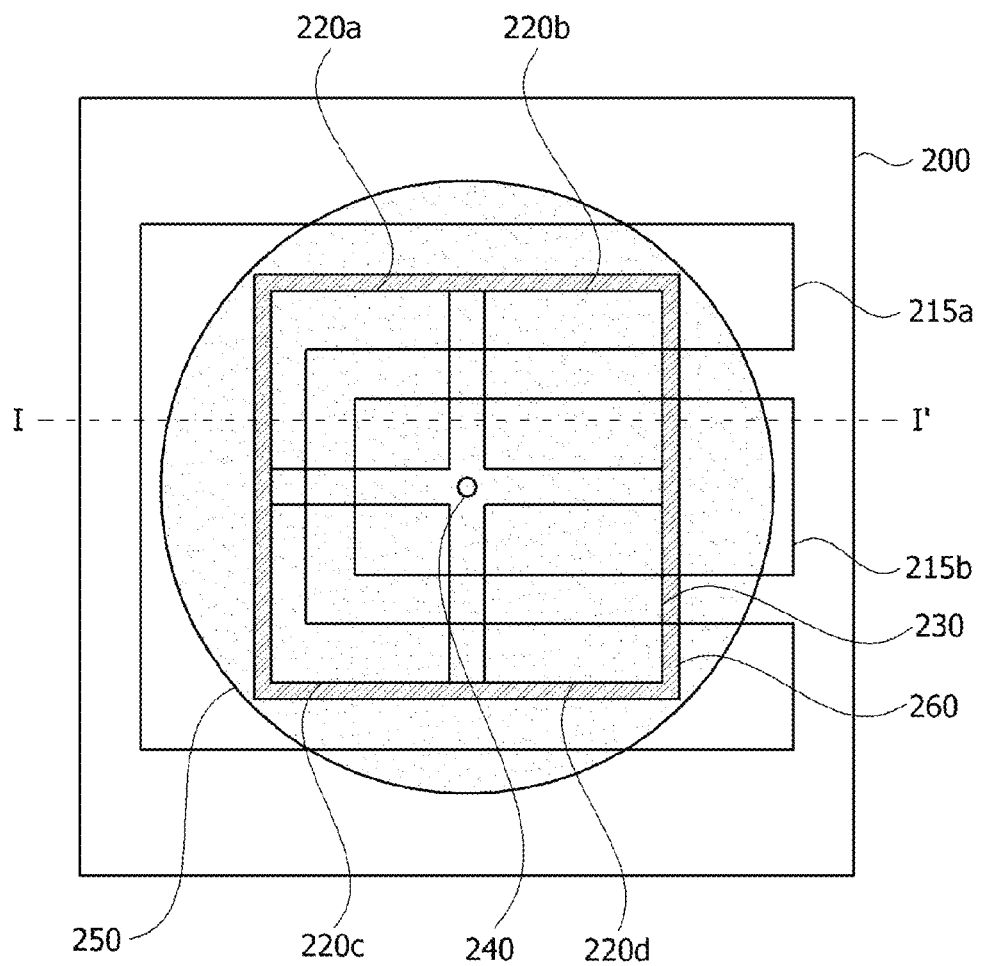
FIG. 6A is a plan view illustrating a light emitting device package according to a second embodiment of the present invention.
Figure 6B:
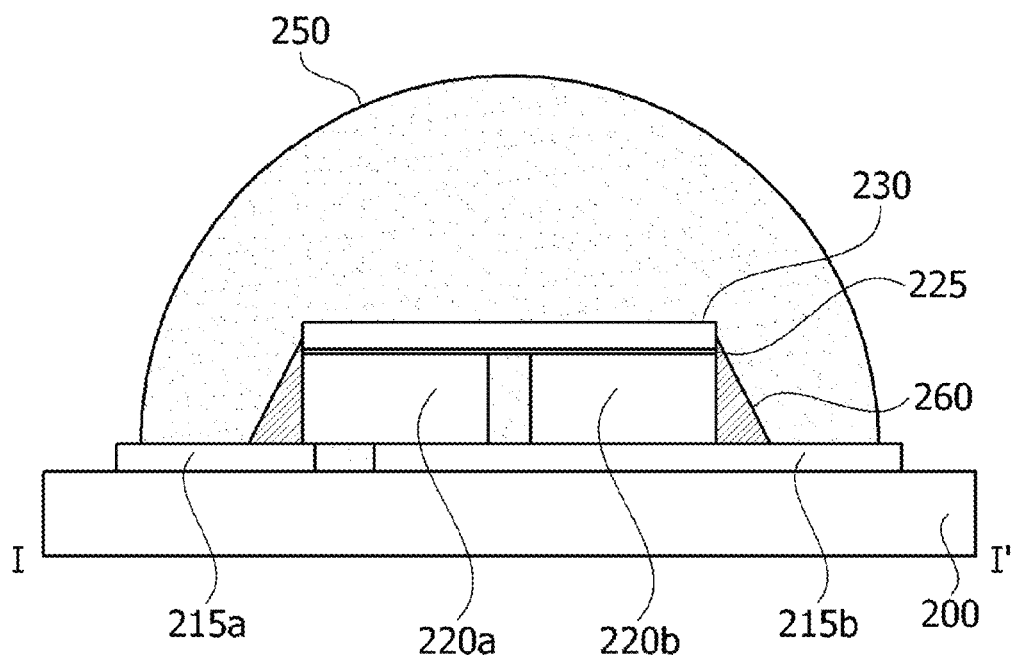
FIG. 6B is a cross-sectional view taken along line I-I' of FIG. 6A.
Figure 6C:
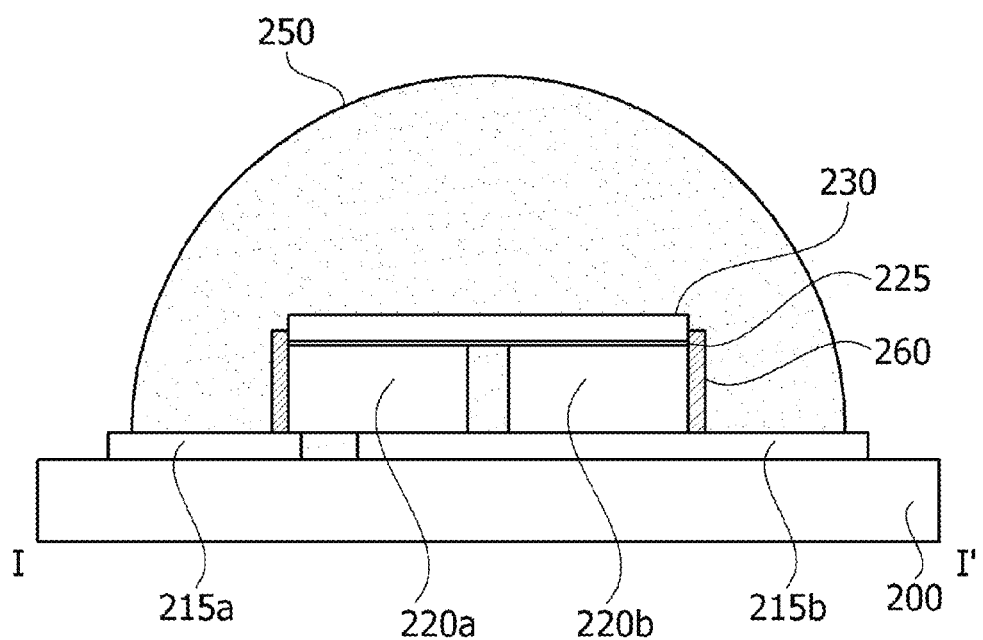
FIG. 6C is another cross-sectional view taken along line I-I' of FIG. 6A.

FIG. 6A is a plan view illustrating a light emitting device package according to a second embodiment of the present invention, and FIG. 6B is a cross-sectional view taken along line I-I' of FIG. 6A. In addition, FIG. 6C is another cross-sectional view taken along line I-I' of FIG. 6A.

As illustrated in FIGS. 6A and 6B, a light emitting device package according to a second embodiment of the present invention includes a substrate 200 having first and second lead frames 215a and 215b, at least two light emitting devices 220a, 220b, 220c, and 220d disposed on the substrate 200 and electrically connected to first and second lead frames 215a and 215b, an integrated wavelength conversion film 230 disposed on at least two of the light emitting devices 220a, 220b, 220c, and 220d and having a first region 230a, which overlaps upper surfaces of the light emitting devices 220a, 220b, 220c, and 220d, and a second region 230b corresponding to a region which separates the light emitting devices 220a, 220b, 220c, and 220d, a reflective member 260 which surrounds side surfaces of the light emitting devices 220a, 220b, 220c, and 220d along an edge of the wavelength conversion film 230, at least one recess 240 which passes through the wavelength conversion film 230 in a region corresponding to gaps between adjacent light emitting devices 220a, 220b, 220c, and 220d, and a lens 250 disposed on the substrate 200 to cover the light emitting devices 220a, 220b, 220c, and 220d and the first and second lead frames 215a and 215b.

The remaining components of the above-described light emitting device package according to the second embodiment of the present invention except the reflective member 260 are the same as those of the first embodiment of the present invention. Likewise, the electrical connection between the light emitting elements may be easily changed. For example, the first lead frame 215a and the second lead frame 215b may be connected to a plurality of light emitting devices 220a, 220b, 220c, and 220d, respectively, with different electrodes. Through such a structure, the plurality of light emitting devices 220a, 220b, 220c, and 220d in the light emitting device package may be connected in parallel.

The reflective member 260 may prevent a phenomenon in which light which is emitted from the side surfaces of the light emitting devices 220a, 220b, 220c, and 220d and does not to pass through the wavelength conversion film 230 leaks from a side surface of the light emitting device package. The reflective member 260 may include a white silicone such as a phenyl silicone and a methyl silicone and may also include reflective particles to improve a reflectivity thereof. For example, the reflective member 260 may also be glass in which $TiO_2$ is distributed, but is not limited thereto.

The above-described reflective member 260 may be formed by a reflective material being applied to cover the surfaces of the light emitting devices 220a and 220b along the edge of the wavelength conversion film 230 and cured. In addition, the reflective member 260 may have a structure in which an end thereof overlaps the wavelength conversion film 230 and completely surrounds the side surfaces of the light emitting devices 220a, 220b, 220c, and 220d. In addition, the reflective member 260 may cover a side surface of the wavelength conversion film 230, but may not cover an upper surface of the wavelength conversion film 230. Through such a structure, the reflective member 260 may reflect only light which is emitted from the side surfaces of the light emitting devices 220a, 220b, 220c, and 220d and does not pass through the wavelength conversion film 230. Meanwhile, as illustrated in FIG. 6C, the reflective member 260 may be formed as a film type and may also be attached to and cover the side surfaces of the light emitting devices 220a and 220b exposed along the edge of the wavelength conversion film 230.

Figure 7A:
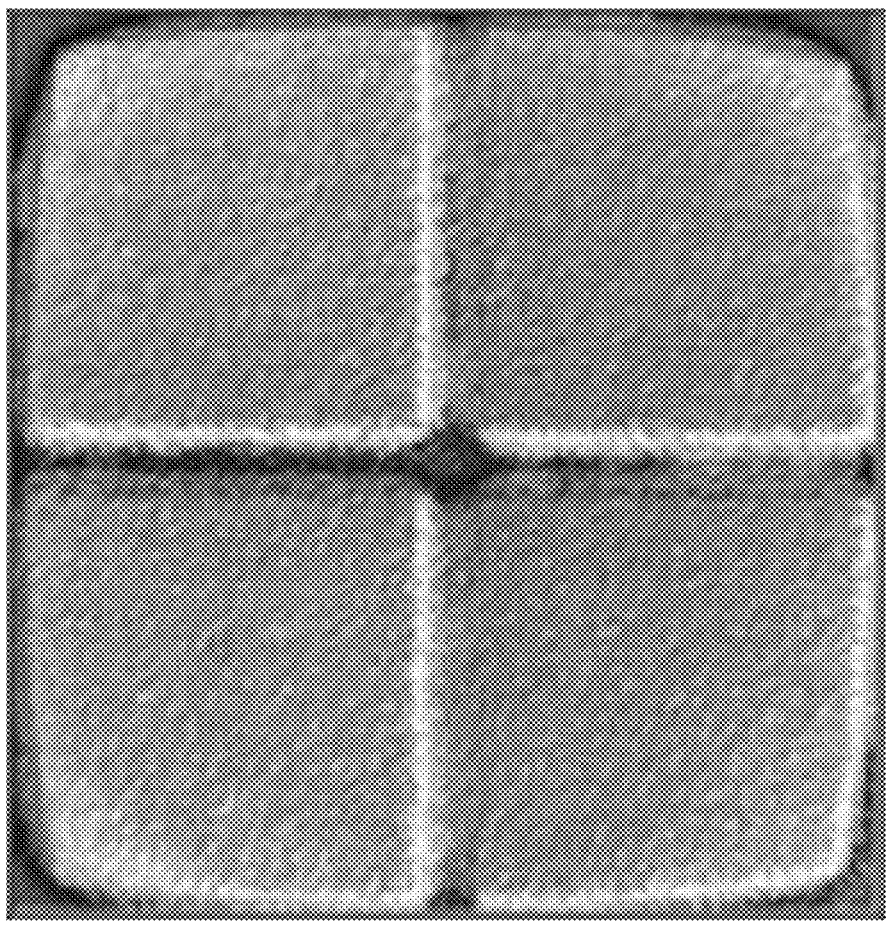
FIGS. 7A and 7B are photographs of light emission of a general light emitting device package.
Figure 7B:
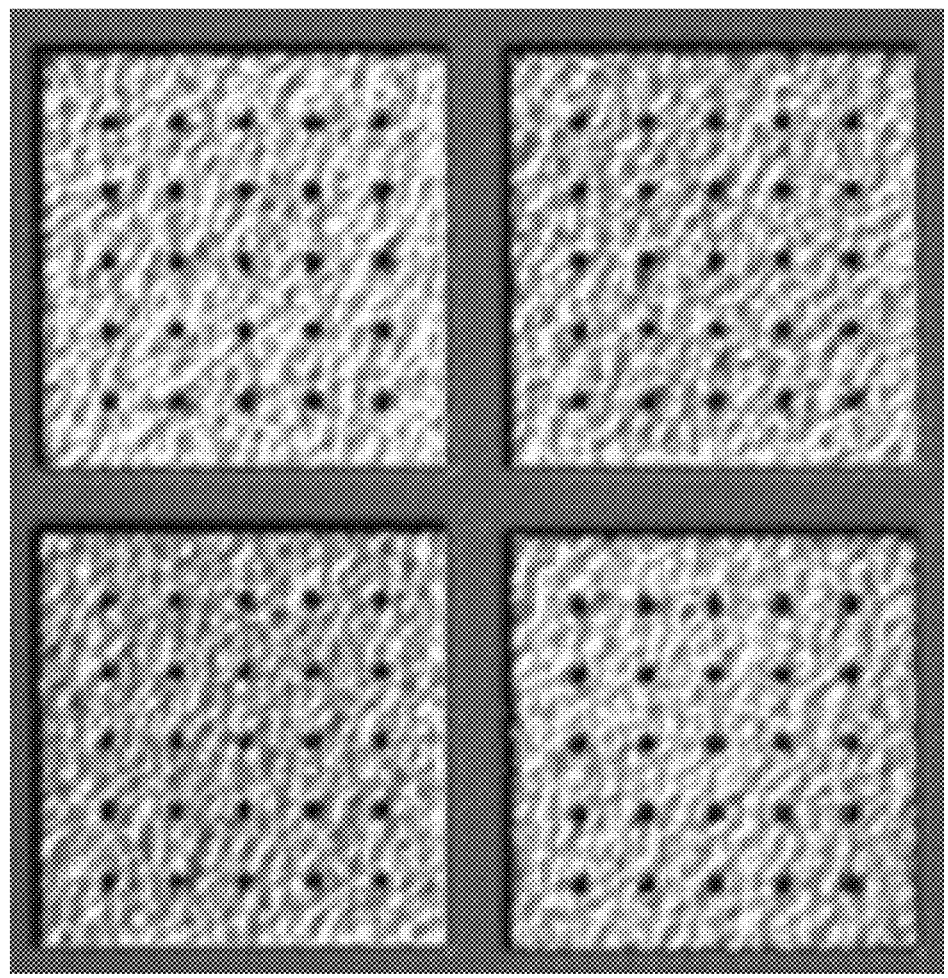
Figure 8A:
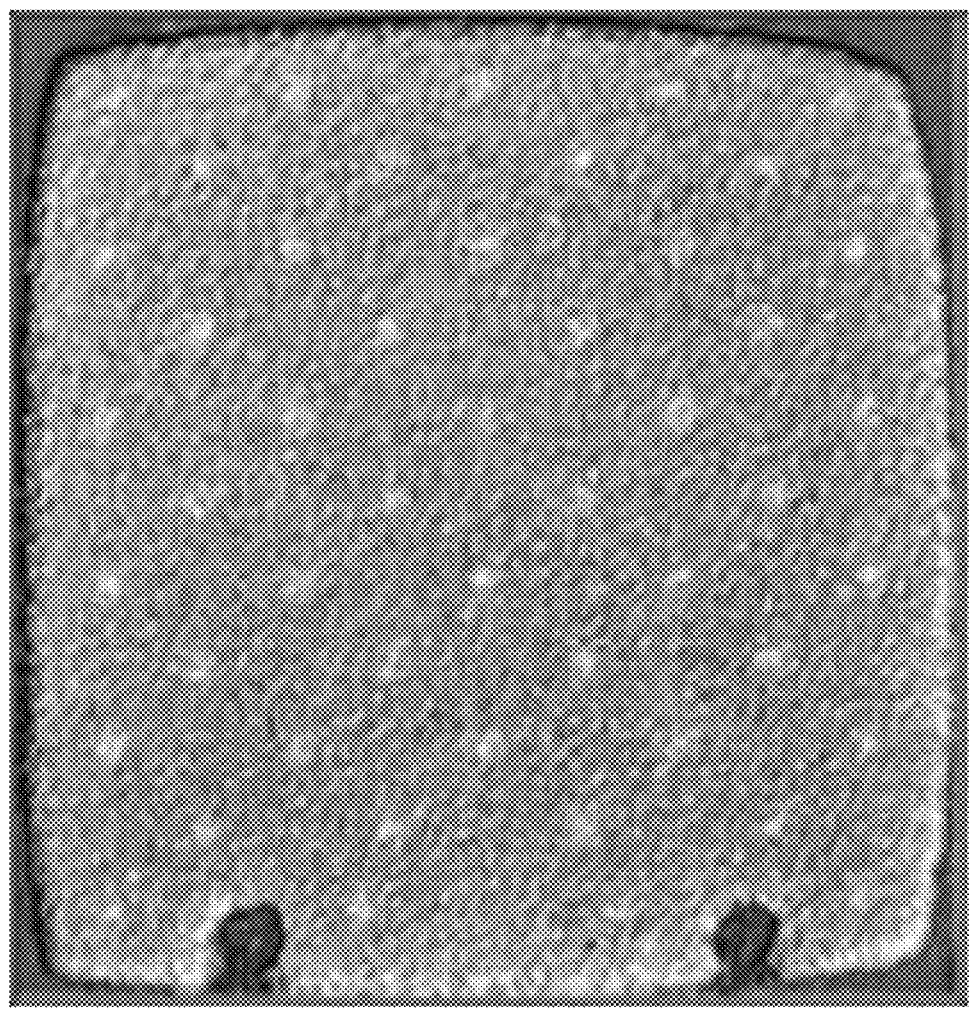
FIGS. 8A and 8B are photographs of light emission of the light emitting device package according to the second embodiment of the present invention.
Figure 8B:
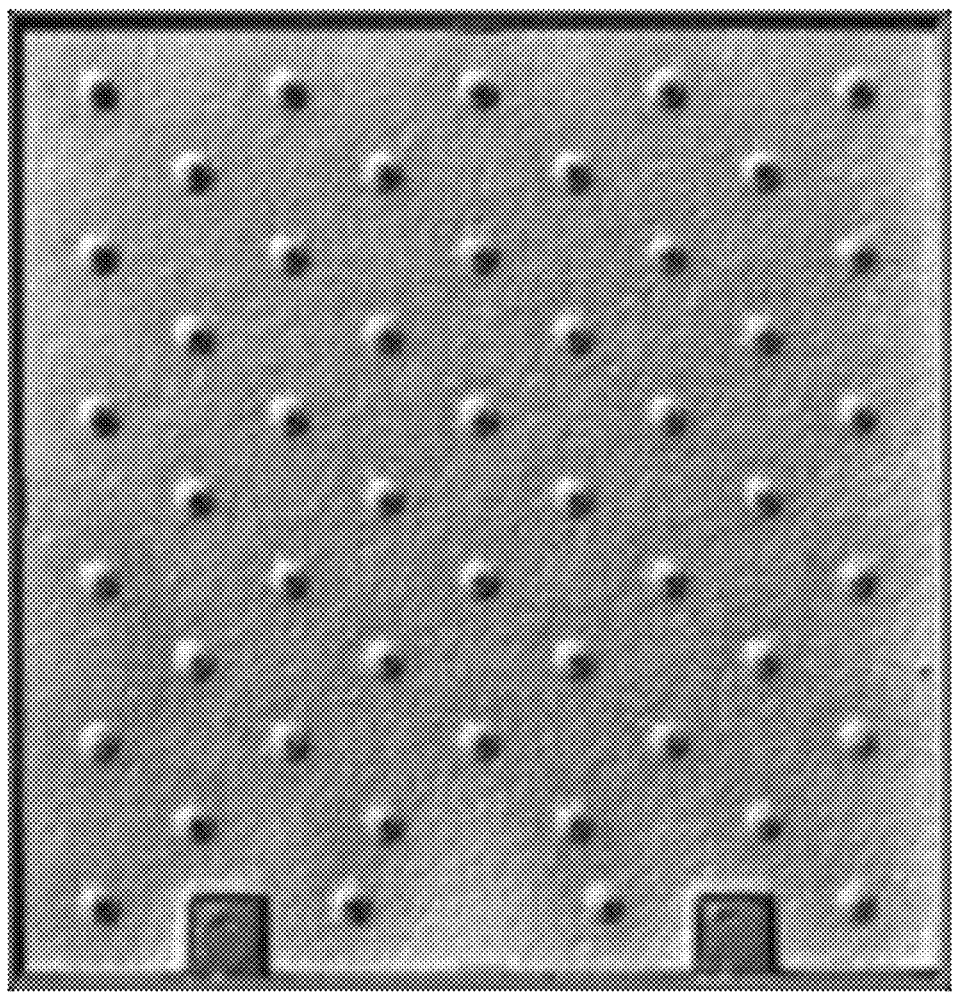

FIGS. 7A and 7B are photographs of light emission of a general light emitting device package, and FIGS. 8A and 8B are photographs of light emission of the light emitting device package according to the second embodiment of the present invention.

As illustrated in FIGS. 7A and 7B, in the general light emitting device package, since wavelength conversion films are individually attached to light emitting devices, white light converted by the wavelength conversion films is not emitted between adjacent light emitting devices, and thus uniform white light is not emitted from the light emitting device package. Furthermore, since an adhesive force of the wavelength conversion film for each of the light emitting devices varies, velocities of light emitted from the light emitting devices also vary. Accordingly, the uniformity of white light is decreased in the general light emitting device package.

On the other hand, as illustrated in FIGS. 8A and 8B, in the light emitting device package according to the embodiment of the present invention, since the wavelength conversion film is also disposed between adjacent light emitting devices, the plurality of light emitting devices share one wavelength conversion film, and thus white light may be uniformly emitted from the light emitting device package.

As described above, in the light emitting device package according to the embodiment of the present invention, since at least two light emitting devices share one wavelength conversion film, color uniformity and color characteristics of light emitted from the light emitting device package are improved. In addition, since the wavelength conversion film includes at least one recess which passes through the wavelength conversion film, a difference in stresses and degrees thereof may be relieved by the recess even when the difference in the stresses and degrees of thermal expansion in the wavelength conversion film occurs as the number and each size of light emitting devices are increased. Accordingly, reliabilities of the wavelength conversion film and the light emitting device package are improved. In addition, since the reflective member which surrounds the side surfaces of the light emitting devices is disposed along the edge of the wavelength conversion film, light emitted from the side surfaces of the light emitting devices is prevented from leaking, and thus a performance of the light emitting devices can be improved.

The above-described light emitting device package according to the embodiment of the present invention may further include optical members, such as a light guide plate, a prism sheet, and a diffusion sheet, which serve as a backlight unit. In addition, the light emitting device package according to the embodiment may be further applied to a display device, a lighting device, and an indicating device.

Here, the display device may include a bottom cover, a reflective plate, a light emitting module, a light guide plate, an optical sheet, a display panel, an image signal output circuit, and a color filter. A backlight unit may be formed of the bottom cover, the reflective plate, the light emitting module, the light guide plate, and the optical sheet.

The reflective plate is disposed on the bottom cover, and the light emitting module emits light. The light guide plate is disposed in front of the reflective plate to guide the light emitted from the light emitting device in a forward direction, and the optical sheet including a prism sheet and the like is disposed in front of the light guide plate. The display panel is disposed in front of the optical sheet and the image signal output circuit supplies the display panel with an image signal, and the color filter is disposed in front of the display panel.

In addition, the lighting device may include a light source module having a substrate and the light emitting device package according to the embodiment, a heat dissipation unit configured to dissipate heat of the light source module, and a power supply configured to process or convert an electrical signal supplied from the outside and supply the processed or converted electrical signal to the light source module. Furthermore, the lighting device may be a lamp, a head lamp, a street lamp, or the like.

As described above, the light emitting device package of the present invention has the following effects.

First, since at least two light emitting devices share one wavelength conversion film, color uniformity and color characteristics of light emitted by the light emitting device package are improved.

Second, since a wavelength conversion film is formed with one or more recess configured to pass through the wavelength conversion film, even when the number and sizes of light emitting devices are increased and there are differences in stresses and degrees of thermal expansion in the wavelength conversion film, the differences may be relieved by the recess. Accordingly, reliability of the wavelength conversion film and the light emitting device package are improved.

Third, since a reflective member which surrounds side surfaces of light emitting devices is disposed along an edge of a wavelength conversion film, light emitted from the side surfaces of the light emitting devices is prevented from leaking, and thus a performance of the light emitting devices can be improved.

The above-described present invention is not limited to the above-described embodiments and the drawings, and it should be apparent to those skilled in the art that various substitutions, modifications, and variations are possible within a range that does not depart from the technical idea of the embodiment.

REFERENCE NUMERALS

11: LIGHT EMITTING STRUCTURE
12: FIRST SEMICONDUCTOR LAYER
13: ACTIVE LAYER
14: SECOND SEMICONDUCTOR LAYER
15a: FIRST INSULATING LAYER
15b: SECOND INSULATING LAYER
16a: FIRST ELECTRODE
16b: SECOND ELECTRODE
17a: FIRST ELECTRODE PAD
17b: SECOND ELECTRODE PAD
100, 200: SUBSTRATE
115a, 215a: FIRST LEAD FRAME
115b, 215b: SECOND LEAD FRAME
115c: CONNECTING ELECTRODE
120a, 120b, 120c, 120d, 220a, 220b, 220c, 220d: LIGHT EMITTING DEVICE
125, 225: ADHESIVE LAYER
130, 230: WAVELENGTH CONVERSION FILM
130a, 230a: FIRST REGION
130b, 230b: SECOND REGION
140, 240: RECESS
150, 250: LENS
215c: THIRD LEAD FRAME
215d: FOURTH LEAD FRAME
215e: FIFTH LEAD FRAME
220: WIRE
260: REFLECTIVE MEMBER

What is claimed is:

1. A light emitting device package comprising:
   a substrate including first and second lead frames;
   at least two light emitting devices disposed on the substrate and electrically connected to the first and second lead frames;
   an integrated wavelength conversion film disposed on the at least two light emitting devices and including a first region which overlaps the light emitting devices and a second region other than the first region; and
   a lens disposed on the substrate to cover the light emitting devices and the first and second lead frames,
   wherein the wavelength conversion film includes at least one recess which passes through the wavelength conversion film in the second region.

2. The light emitting device package of claim 1, wherein a thickness of the wavelength conversion film is in a range of 50 to 100 μm.

3. The light emitting device package of claim 1, wherein the wavelength conversion film is attached to the light emitting devices through an adhesive layer.

4. The light emitting device package of claim 3, wherein the adhesive layer includes a phenyl-based silicone and a methyl-based silicone.

5. The light emitting device package of claim 4, wherein content of the phenyl-based silicone included in the adhesive layer is less than that of the methyl-based silicone.

6. The light emitting device package of claim 1, wherein the recess is formed at a central portion of the wavelength conversion film between the light emitting devices.

7. The light emitting device package of claim 1, wherein a diameter of the recess is in a range of 40 to 120 μm.

8. The light emitting device package of claim 1, wherein:
   the lens includes a transparent resin; and
   the resin is located between the second region and the substrate and included inside the recess.

9. The light emitting device package of claim 1, wherein an edge of the wavelength conversion film protrudes past edges of the light emitting devices.

10. A light emitting device package comprising:
    a substrate including first and second lead frames;
    at least two light emitting devices disposed on the substrate and electrically connected to the first and second lead frames;
    an integrated wavelength conversion film disposed on the at least two light emitting devices and including a first region which surrounds an upper surface and side surfaces of the light emitting devices and a second region other than the first region;
    a reflective member which surrounds the side surfaces of the light emitting devices along an edge of the wavelength conversion film; and
    a lens disposed on the substrate to cover the light emitting devices and the first and second lead frames,
    wherein the wavelength conversion film includes at least one recess which passes through the wavelength conversion film in the second region.

11. The light emitting device package of claim 10, wherein a thickness of the wavelength conversion film is in a range of 50 to 100 μm.

12. The light emitting device package of claim 10, wherein the wavelength conversion film is attached to the light emitting devices through an adhesive layer.

13. The light emitting device package of claim 12, wherein the adhesive layer includes a phenyl-based silicone and a methyl-based silicone.

14. The light emitting device package of claim 13, wherein content of the phenyl-based silicone included in the adhesive layer is less than that of the methyl-based silicone.

15. The light emitting device package of claim 10, wherein the recess is formed at a central portion of the wavelength conversion film between the light emitting devices.

16. The light emitting device package of claim 10, wherein a diameter of the recess is in a range of 40 to 120 μm.

17. The light emitting device package of claim 10, wherein the reflective member completely surrounds the side surfaces of the light emitting devices exposed along the edge of the wavelength conversion film.

18. The light emitting device package of claim 17, wherein the reflective member has a type of film that is attached to and surrounds the side surfaces of the light emitting devices exposed along the edge of the wavelength conversion film.

19. The light emitting device package of claim 10, wherein:
    the lens includes a transparent resin; and
    a gap between the second region and the substrate and an inside of the recess are filled with the resin.

20. The light emitting device package of claim 10, wherein the edge of the wavelength conversion film protrudes from edges of the light emitting devices.

* * * * *